US008671875B2

(12) United States Patent
Nagamine et al.

(10) Patent No.: US 8,671,875 B2
(45) Date of Patent: Mar. 18, 2014

(54) LIQUID PROCESSING APPARATUS, LIQUID PROCESSING METHOD AND STORAGE MEDIUM

(75) Inventors: Shuichi Nagamine, Koshi (JP); Naofumi Kishita, Koshi (JP); Satoshi Biwa, Koshi (JP); Kouji Fujimura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 671 days.

(21) Appl. No.: 12/540,219

(22) Filed: Aug. 12, 2009

(65) Prior Publication Data

US 2010/0040779 A1 Feb. 18, 2010

(30) Foreign Application Priority Data

Aug. 12, 2008 (JP) ................. 2008-208093

(51) Int. Cl.
*B05B 13/04* (2006.01)
*B05C 11/00* (2006.01)

(52) U.S. Cl.
USPC ............................ 118/320; 118/708; 427/240

(58) Field of Classification Search
CPC .......................... G03F 7/162; H01L 21/67155
USPC ......................................................... 118/320
See application file for complete search history.

(56) References Cited

U.S. PATENT DOCUMENTS

2006/0189103 A1* 8/2006 Matsuoka et al. ............ 438/478

FOREIGN PATENT DOCUMENTS

| JP | 2002-118051 A | 4/2002 |
|----|---------------|--------|
| JP | 2006-229062 A | 8/2006 |
| JP | 2007-73729 A | 3/2007 |
| JP | 2007-305624 A | 11/2007 |

OTHER PUBLICATIONS

An Office Action dated Nov. 30, 2010, issued from the Japanese Patent Office for Japanese Patent Application No. 2008-208093, and English translation thereof.

* cited by examiner

*Primary Examiner* — Dah-Wei D Yuan
*Assistant Examiner* — Stephen Kitt
(74) *Attorney, Agent, or Firm* — Abelman, Frayne & Schwab (57) ABSTRACT

Disclosed is a liquid processing apparatus capable of increasing the number of arranged substrate retainers without increasing the total exhaust amount of the liquid processing apparatus. A N-number (N is an integer identical to or greater than three) of cup bodies are inhaled and exhausted in total exhaust amount E through a plurality of separate exhaustion passage each having a first damper, and through a common exhaustion passage connected in common downstream of the separate exhaustion passages. The first dampers are configured such that an external air is received from the cup body in a first intake amount of external air $E1$ for one of the cup bodies where a chemical liquid nozzle is placed at a setting location facing a wafer, and an external air is received from each of the other cup bodies in a second intake amount of external air $E2$ less than the first amount $E1$ and the intake amount of external air from both each of the other cup bodies and each of branched passages equals $(E-E1)/(n-1)$.

7 Claims, 10 Drawing Sheets

LIQUID PROCESSING APPARATUS, LIQUID PROCESSING METHOD AND STORAGE MEDIUM

This application is based on and claims priority from Japanese Patent Application No. 2008-208093, filed on Aug. 12, 2008 with the Japanese Patent Office, the disclosure of which is incorporated herein in its entirety by reference.

TECHNICAL FIELD

The present invention relates to a liquid processing apparatus, a liquid processing method and a storage medium. Particularly, the present invention relates to the liquid processing of semiconductor wafer or liquid crystal display substrate, such as applying a resist and development after exposing.

BACKGROUND

A manufacturing process for a semiconductor device or LCD substrate includes forming a resist pattern on a substrate. Particularly, a resist pattern is formed on a substrate, for example a semiconductor wafer (hereinafter "wafer"), by forming a resist layer on the substrate, exposing the resist layer through a photomask, and developing the exposed wafer to obtain a desired pattern. Such process has been performed using an application and development device.

An application and development device includes a liquid processing unit, which contains an application unit to apply resist liquid, and an anti-reflection layer forming unit, which applies a reflection resistant chemical. Further, the device includes multiple application and anti-reflection layer forming units in order to achieve a high throughput.

Figure 11:
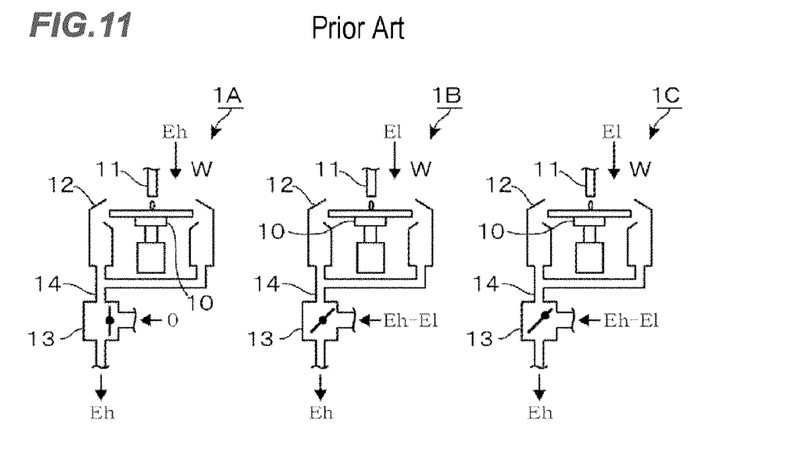
FIG. 11 is a diagram illustrating the exhaustion unit of a conventional liquid processing apparatus.

As shown in FIG. 11, a liquid processing unit places a wafer W on a spin chuck 10, drops chemical liquid, such as resist liquid, from a nozzle 11 placed above spin chuck 10, and spin coats wafer W, spreading the chemical liquid diametrically using centrifugal force caused by rotating wafer W. During the spin coating, wafer W scatters a mist of liquid to an outside. Thus, a cup body 12 is provided around spin chuck 10, with an exhaustion passage 14 having a damper 13 is connected to the bottom of cup body 12. Accordingly, the atmosphere of cup body 12 is inhaled and exhausted through exhaustion passage 14.

The liquid processing unit performs spin coating, film drying, edge cutting (where a resist layer solvent is applied at the outer edge of wafer W to remove unnecessary resist layer), or drying. Each liquid processing unit has a high exhaust amount during spin coating, where the number of rotations is high, generating a large amount of mist. On the other hand, the exhaust amount is low during film drying, where the number of rotations is less than during spin coating in order to form a layer having a uniform thickness. The exhaust amount of the liquid processing unit is high again during edge cutting or drying, as the number of rotations is increased. In exhaustion passage 14, downstream of damper 13, the amount of exhaust is adjusted to equal a high exhaust amount. By controlling the opening of damper 13, a low amount of exhaust is channeled from upstream of damper 13. Thus, the exhaust amount can be controlled high and low.

Although the liquid processing unit controls the exhaust amount based on the type of processing, the unit usually sets the exhaust amount at high. Thus, the total exhaust amount of the application and development unit in which a plurality of liquid processing units is provided is (exhaust amount of one liquid processing unit)×(the number of liquid processing units). With reference to FIG. 11, the total exhaust amount is illustrated. Assume that there are three liquid processing units, and among them liquid processing unit 1A exhausts a high exhaust amount, while the other two liquid processing units 1B and 1C each have a low exhaust amount.

In the example, each liquid processing unit, 1A to 1C, emits a high exhaust amount (Eh) into exhaustion passage 14 downstream of damper 13. Damper 13 in liquid processing unit 1A is closed, and the upstream side of damper 13, that is to say, the inside of cup body 12, has a high exhaust amount Eh. Thus, when damper 13 is open external air enters liquid processing units 1B and 1C. Accordingly, the inside of cup body 12, upstream of damper 13, has a low exhaust amount E1. The amount of external air entering liquid processing units 1B and 1C is the difference between the high and low exhaust amounts (Eh−E1) making the exhaust amount for each liquid processing unit equal to the high exhaust amount Eh. Therefore, when there are three liquid processing units, the total exhaust amount E equals the sum of the three liquid processing units (E=3×Eh).

Figure 12:
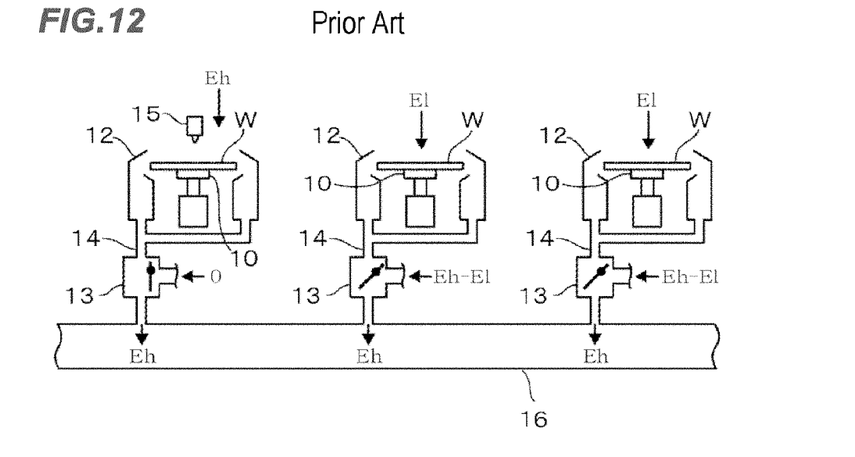
FIG. 12 is a diagram illustrating the exhaustion unit of a conventional liquid processing apparatus.

An inventor has proposed, as shown in Japanese Laid-Open Patent Publication No. 2006-229062, improving throughput by separating a block for applying a resist layer containing both a resist liquid application unit and an anti-reflection forming unit, and a block for development, independently forming transfer passages for wafers from a carrier block to an exposure device and from the exposure device to the carrier block. As shown in FIG. 12, multiple cup bodies 12, which are part of the liquid processing unit, can be arranged in parallel along the transfer passage. In this example, three (3) cup bodies 12 are arranged in parallel along the transfer passage. A common nozzle 15 is movably positioned along the transfer passage. Wafers placed in cup bodies 12 are sprayed with a resist liquid by moving and locating common nozzle 15 above each cup body 12.

Each exhaustion passage 14 is connected to the bottom of cup body 12. The atmosphere of each cup body 12 is inhaled and exhausted through a common passage 16 placed along the heat of cup body 12. As in FIG. 11, cup bodies 12 exhaust uniformly through exhaustion passage 14, downstream of damper 13, with high exhaust amount Eh. Also, when the exhaust amount of cup body 12 is the low exhaust amount E1, external air enters exhaustion passage 14 in the amount of (Eh−E1), in addition to the low exhaust amount E1 from upstream of damper 13, by controlling the opening of damper 13. Thus, a total exhaust amount E of liquid processing units can be calculated by (exhaust amount Eh of each cup body 12)×(the number of cup bodies).

This process requires multiple cup bodies for enhancing the throughput. However, an organic material may be included in the mist if the total exhaust amount of the liquid processing units is increased according to the number of cup bodies. Thus, the exhaust amount of the organic material and power consumption are increased, which is not desirable for reducing $CO_2$ emission. Accordingly, it would be necessary to increase the number of arranged cup bodies without increasing the total exhaust amount.

Japanese Laid-Open Patent Publication No. 2006-229062 discloses exhausting the inside of a cup body at a set exhaust amount corresponding to the number of rotations of a substrate retainer. Accordingly, mist is prevented from attaching to the substrate, allowing a thin layer having uniform thickness to form. However, the exhaust amount is still controlled by the level of a damper, and the exhaust amount of downstream of the damper equals the high exhaust amount Eh. Thus, the total exhaust amount increases with an increased number of cup bodies. Accordingly, the stated drawbacks are not solved with this technology.

SUMMARY

According to one embodiment, a liquid processing apparatus is provided. The liquid processing apparatus includes a N-number of substrate retainers arranged in parallel to each other in a common case. N is an integer identical to or greater three. Circumferences of the substrate retainers are surrounded with cup bodies. Chemical liquid is applied to substrates retained in the substrate retainers by rotating the substrate retainers while a common chemical liquid nozzle supplies the chemical liquid to the substrates. The common chemical liquid nozzle is configured to be movable in along an arrangement direction of the substrate retainers. The liquid processing apparatus further includes a plurality of separate exhaustion passages each connected to the cup bodies, each separate exhaustion passage including a branched passage open in the common case, a common exhaustion passage connected downstream of the separate exhaustion passages, inner atmosphere of the common exhaustion passage being inhaled and exhausted with a exhaust amount E, a first controller for an intake amount of external air connected to each of the separate exhaustion passages and to control the intake amount of external air from the cup bodies and the intake amount of external air from the branched passages, and a control part to generate a control signal, the control signal setting the first controller, corresponding to one of the cup bodies where the chemical liquid nozzle is located at a setting location facing the substrate on the substrate retainer, to a first condition, and the first controller corresponding to the others of the cup bodies to a second condition. At the first condition, the first controller receives the external air, not from the branched passage but from the corresponding cup body in a first intake amount of external air E1. At the second condition, the first controller receives the external air from the corresponding cup body in a second intake amount of external air E2, less than the first intake amount of external air E1, and the intake amount of external air from both the cup body and the branched passage equals $(E-E1)/(n-1)$.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present invention can provide a liquid processing apparatus capable of increasing the number of arranged substrate retainers without increasing a total exhaust amount According to one embodiment, a liquid processing apparatus is provided. The liquid processing apparatus includes a N-number of substrate retainers arranged in parallel to each other in a common case. N is an integer identical to or greater three. Circumferences of the substrate retainers are surrounded with cup bodies. Chemical liquid is applied to substrates retained in the substrate retainers by rotating the substrate retainers while a common chemical liquid nozzle supplies the chemical liquid to the substrates. The common chemical liquid nozzle is configured to be movable in along an arrangement direction of the substrate retainers. The liquid processing apparatus further includes a plurality of separate exhaustion passages each connected to the cup bodies, each separate exhaustion passage including a branched passage open in the common case, a common exhaustion passage connected downstream of the separate exhaustion passages, inner atmosphere of the common exhaustion passage being inhaled and exhausted with a exhaust amount E, a first controller for an intake amount of external air connected to each of the separate exhaustion passages and to control the intake amount of external air from the cup bodies and the intake amount of external air from the branched passages, and a control part to generate a control signal, the control signal setting the first controller, corresponding to one of the cup bodies where the chemical liquid nozzle is located at a setting location facing the substrate on the substrate retainer, to a first condition, and the first controller corresponding to the others of the cup bodies to a second condition. At the first condition, the first controller receives the external air, not from the branched passage but from the corresponding cup body in a first intake amount of external air E1. At the second condition, the first controller receives the external air from the corresponding cup body in a second intake amount of external air E2, less than the first intake amount of external air E1, and the intake amount of external air from both the cup body and the branched passage equals $(E-E1)/(n-1)$.

The control part may set the first controller to the first or second condition, based on a location of the chemical liquid nozzle. The common exhaustion passage may include one end open in the case, and a second controller for the intake amount of external air to control the intake amount of external air entering the common exhaustion passage. The control part may change the intake amount of external air by the second controller in the case where the chemical liquid nozzle is placed at the setting location for the one cup body or in the case where the chemical liquid nozzle is not placed at the setting location for any of the cup bodies. The control part may control the second controller such that the external air is not received in the common exhaustion passage when the chemical liquid nozzle is placed at the setting location for the one cup body, and the external air is received in the common exhaustion passage when the chemical liquid nozzle is not placed at the setting location for any of the cup bodies. The first controller may be a damper. The second controller may be a damper. The number of the substrate retainers may be not less than 3 but not more than 6 ($3 \leq n \leq 6$).

According to another embodiment, a liquid processing method is provided. The liquid processing method includes arranging a N-number of substrate retainers in parallel to each other in a common case, N being an integer identical to or greater three, and surrounding circumferences of the substrate retainers with cup bodies, applying chemical liquid to substrates retained in the substrate retainers by rotating the substrate retainers while a common chemical liquid nozzle supplies the chemical liquid to the substrates, the common chemical liquid nozzle being configured to be movable along an arrangement direction of the substrate retainers, inhaling and exhausting the cup bodies with an exhaust amount E through a plurality of separate exhaustion passages and a common exhaustion passage connected downstream of the separate exhaustion passages, each separate exhaustion passage including a branched passage open in the case and a first controller for an intake amount of external air connected to the branched passage, controlling the first controller such that the external air is received, not from the branched passage but from the cup body in a first intake amount of external air $E1$ for one of the cup bodies where the chemical liquid nozzle is placed at a setting location facing the substrate on the substrate retainer, and controlling the first controller for the others of the cup bodies such that the external air is received from each of the others of the cup bodies in a second intake amount of external air $E2$, less than the first intake amount of external air $E1$, and the intake amount of external air from both the cup body and the branched passage equals $(E-E1)/(n-1)$.

The common exhaustion passage may include one end open in the case. The method may further include controlling the intake amount of external air by a second controller for the intake amount of external air, the second controller being received in the common exhaustion passage, in the case where the chemical liquid nozzle is placed at the setting location for the one cup body or in the case where the chemical liquid nozzle is not placed at the setting location for any of the cup bodies. The method may further include controlling the second controller such that the external air is not received in the common exhaustion passage when the chemical liquid nozzle is placed at the setting location for the one cup body, and the external air is received in the common exhaustion passage when the chemical liquid nozzle is not placed at the setting location for any of the cup bodies.

According to still another embodiment, there is provided a computer readable storage medium on which is stored a computer program that causes a computer to execute a method for applying chemical liquid to a substrate by using a liquid processing apparatus. The computer program includes instructions to perform the liquid processing method.

According to one embodiment, there is provided a liquid processing apparatus having N-number (N is an integer identical to or greater than three) of substrate retainers, which cup bodies surround. The inside cup bodies are inhaled and exhausted in exhaust amount E through a plurality of separate exhaustion passages having first controllers for an intake amount of external air, and through a common exhaustion passage connected downstream of the separate exhaustion passages. The first controllers are configured such that, when the chemical liquid nozzle of the apparatus is placed at a setting location where the chemical liquid nozzle faces a substrate on the substrate retainer in one cup body, the intake amount of external air $E1$ is received from that cup body, and the intake amount of external air $E2$ is received from each of the other cup bodies and a combined intake amount of external air from each pair of other cup bodies and branched passages equals to $(E-E1)/(n-1)$. Thus, even if N-number (N is an integer identical to or greater than three) of substrate retainers are arranged, an increase of the total exhaust amount can be prevented and more substrate retainers can be placed.

An illustrative embodiment of a liquid processing apparatus, used in an application device for applying resist liquid to a substrate, such as a wafer W, will be described hereinafter. Reference numeral 2 in FIG. 1 indicates a liquid processing apparatus. Liquid processing apparatus 2 includes a N-number (N is an integer equal to or greater than three) of liquid processing units, for example, four liquid processing units 21 to 24, arranged transversely (along the Y-axis in FIG. 1) in parallel, in a common case 20. Liquid processing units 21 to 24 have the same configurations. Thus, FIG. 2 illustrates liquid processing unit 21, an example of a liquid processing unit described in detail.

Figure 2:
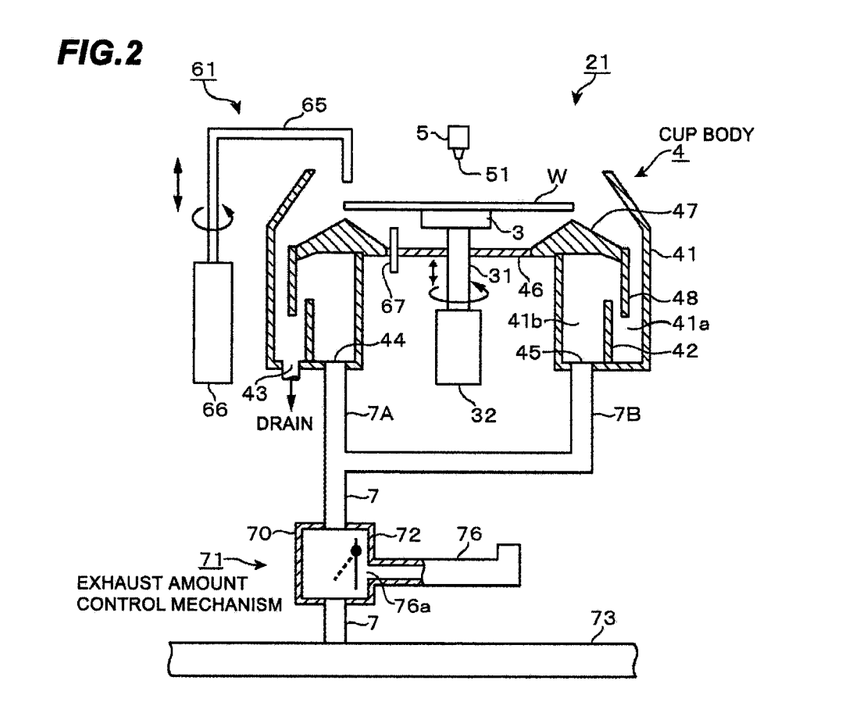
FIG. 2 is a cross sectional view illustrating a part of the liquid processing part provided in the liquid processing apparatus of FIG. 1.

Reference number 3 shown in FIG. 2 indicates a spin chuck of a substrate retainer, which adheres to the center of the rear surface of wafer W and holds wafer W in a horizontal position. Spin chuck 3 connects to a driving mechanism 32 through an axis 31, and is configured to rotate and rise by driving mechanism 32, while retaining wafer W. A cup body 4 having an open upper portion is provided at the periphery of wafer W, held by spin chuck 3 such that cup body 4 surrounds wafer W. An upper side portion of cup body 4 is slanted inward. A liquid receiving part 41, having a concave shape, is provided at a bottom side of cup body 4 such that liquid receiving part 41 is laid along and under the entire circumference of wafer W. A dividing member 42 divides liquid receiving part 41 into an outer region 41a and an inner region 41b. A discharge hole 43 is provided at the bottom of outer region 41a to drain captured applying liquid. Further, two exhaustion holes 44 and 45 are provided at a bottom of inner region 41b.

A circular plate 46 is further provided under wafer W. A ring member 47 is provided to surround circular plate 46. An end plate 48 is provided on an end surface of outside ring member 47. End plate 48 extends downward and enters outer region 41a. End plate 48 is configured such that applying liquid is transferred to surfaces of end plate 48 and ring member 47 and then guided to outer region 41a. A lifting pin (not shown) that supports the rear surface of wafer W and can rise and fall is provided such that the lifting pin penetrates circular plate 46 up and down. In corroboration with the lifting pin and an external carrier, a wafer can be transferred between spin chuck 3 and the external carrier.

Figure 3:
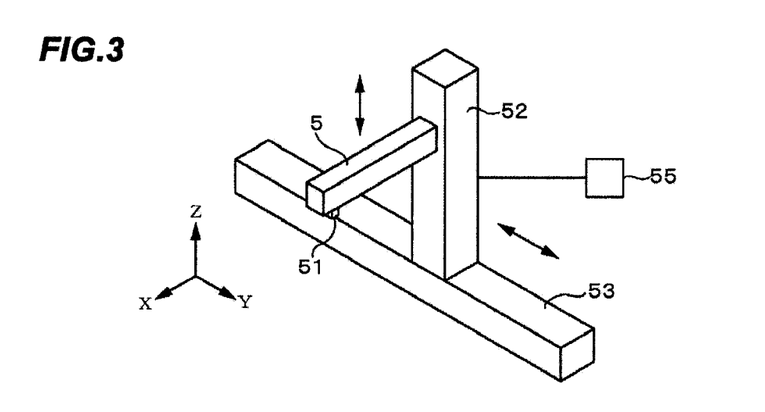
FIG. 3 is a perspective view of the liquid nozzle provided in the liquid processing apparatus of FIG. 1.

Referring again to FIG. 1, reference numeral 5 indicates a common chemical liquid nozzle to supply chemical liquid to four liquid processing units 21 to 24. A nozzle part 51 is formed at a front end of common chemical liquid nozzle 5 and has a fine discharge hole to discharge chemical liquid, such as resist liquid. As illustrated in FIG. 3, chemical liquid nozzle 5 is configured to rise and fall in a Z-axis direction by a moving mechanism 52 connected to a motor, for example, a driving part 55, and is configured to be moved in a Y-axis direction according to a guide rail 53 provided along the longitudinal direction (Y direction) of liquid processing apparatus 2. Reference numeral 54 is a waiting region for chemical liquid nozzle 5 and is provided at an outside the end of liquid processing unit 21. Chemical liquid nozzle 5 is configured to move between the waiting region and the applying locations by moving mechanism 52. The applying locations are for applying the chemical liquid to wafer W held on spin chuck 3. When chemical liquid nozzle 5 is located at the applying location, the discharge hole of nozzle part 51 discharges chemical liquid with respect to the rotational center of wafer W. In this case the applying location refers to a set location. The driving of chemical liquid nozzle 5 is controlled by a control part 8 which will be described later.

Figure 1:
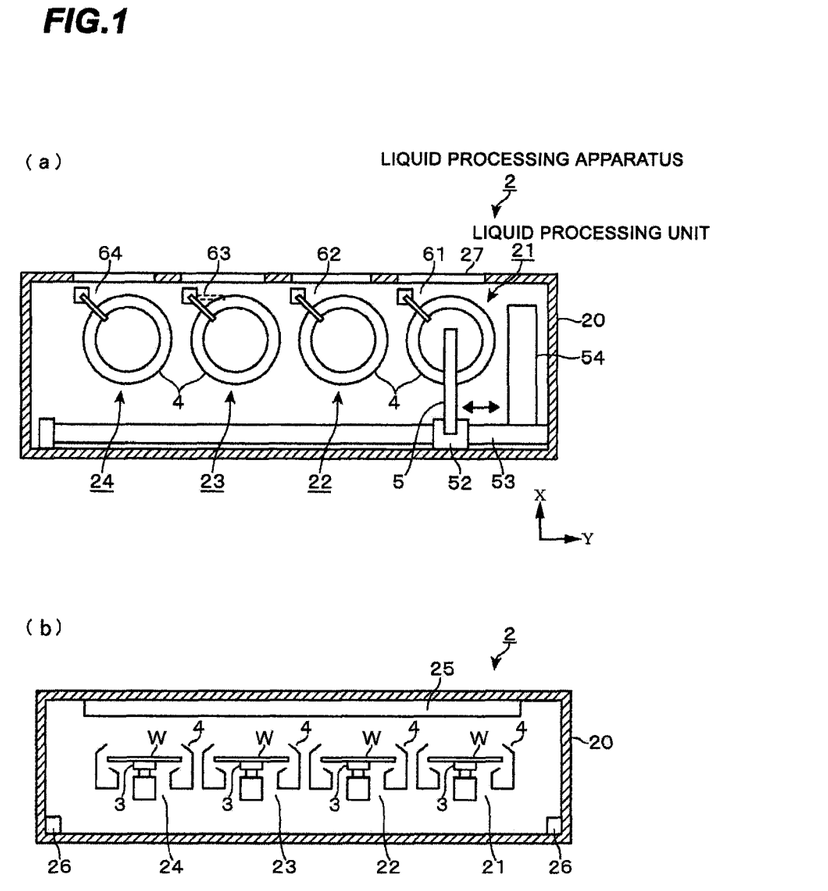
FIG. 1 shows diagrams illustrating a plan view (a) and a cross sectional view (b) of an illustrative embodiment of a liquid processing apparatus.

Reference numeral 25, illustrated in FIG. 1, indicates a filter unit attached at the ceiling portion of liquid processing apparatus 2. Reference numeral 26 indicates an exhaustion part provided at a bottom surface of liquid processing apparatus 2. A certain exhaust amount is exhausted from exhaustion part 26, and a certain amount of clear air is provided from filter unit 25. Thus, down flow of the clean air is formed in liquid processing apparatus 2. Reference numeral 27 is a loading/unloading port for wafer W that on the surface adjacent to a moving region of a carrier external to liquid processing apparatus 2.

Reference numerals 61 to 64 indicate edge cut mechanisms to supply a solvent for an applying layer, for example, a resist layer, to an edge portion of the circumference of wafer W held by spin chuck 3. Because these edge cut mechanisms have the same configuration, one edge cut mechanism 61 illustrated in FIG. 2 will be described. Edge cut mechanism 61 is provided adjacent to liquid processing unit 21, and includes a solvent nozzle 65 that is curved in an L-shape, and a driving part 66 to drive solvent nozzle 65 to rise and fall in a vertical direction and rotate. Solvent nozzle 65 is configured to move by driving part 66 between a processing location (see FIG. 2) that supplies the solvent to the edge portion of the circumference of wafer W held on spin chuck 3 and a waiting location outside of cup body 4 (See FIG. 1). Reference numeral 67 indicates a cleaning nozzle to supply cleaning liquid to a rear surface of wafer W retained by spin chuck 3. Chemical liquid nozzle 5, solvent nozzle 65, cleaning nozzle 67 each are connected to sources that provide chemical liquid such as resist liquid, the solvent for the applying layer such as the resist layer, and cleaning liquid through a supply system (not shown).

Exhaustion passages 7A and 7B are connected to exhaustion holes 44 and 45, positioned at the bottom of the inner region of cup body 4. Exhaustion passages 7A and 7B are then connected at the middle of exhaustion passages 7A and 7B to form one separate exhaustion passage 7. Separate exhaustion passage 7 has an exhaust amount control mechanism 71. Exhaust amount control mechanism 71 has a first damper 72 at inside, forming a first controller for an intake amount of external air. Separate exhaustion passage 7 is not shown in the diagram illustrated in FIG. 1.

Figure 5:
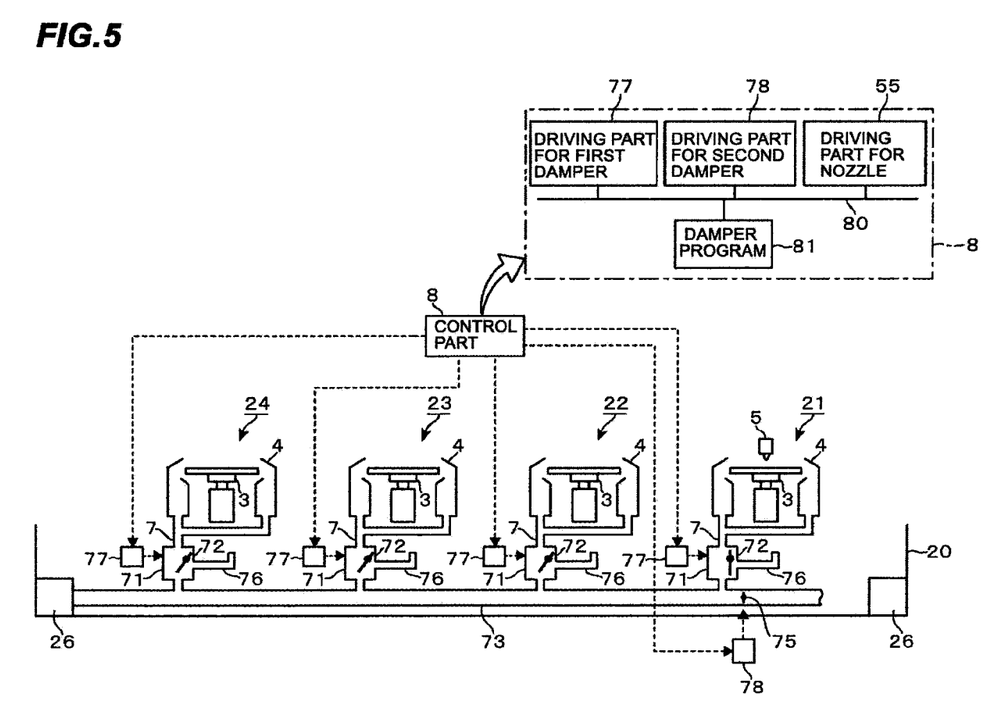
FIG. 5 shows a diagram illustrating the exhaustion unit provided in the liquid processing apparatus of FIG. 1.

As illustrated in FIGS. 2 and 5, a proximal end of separate exhaustion passage 7 of each of liquid processing units 21 to 24 is connected to a common exhaustion passage 73. Common exhaustion passage 73 is provided in case 20, and has one end open to case 20 and another end connected to exhaustion part 26. An inside of common exhaustion passage 73 is inhaled and exhausted with exhaust amount E. Common exhaustion passage 73 has a second damper 75 between the one end of common exhaustion passage 73 and a region where a liquid processing unit (liquid processing unit 21 in this case) that is the closest to the one open end is connected to separate exhaustion passage 7. Second damper 75 forms a second controller for the intake amount of external air.

With reference to FIG. 2, exhaust amount control mechanism 71 will be described. Exhaust amount control mechanism 71 includes first damper 72 and a branched passage 76 for intake of external air. First damper 72 is provided at an inside of an exhaust amount control chamber 70 and forms the first controller for an intake amount of external air. Branched passage 76 is connected to exhaust amount control chamber 70. Branched passage 76 has one end open to case 20. First damper 72 controls an intake amount of external air from cup body 4 and an intake amount of external air from branched passage 76. For example, external air refers to atmosphere in case 20. Although it is illustrated that exhaust amount control mechanism 71 is composed of: exhaust amount control chamber 70 provided at separate exhaustion passage 7; first damper 72 installed within exhaust amount control chamber 70; and branched passage 76 installed at exhaust amount control chamber 70, first damper 72 can be provided directly in separate exhaustion passage 7 and branched passage 76 can be provided on separate exhaustion passage 7 itself.

The first controller for an intake amount of external air is configured to be set as a first condition and a second condition. For example, when first dampers 72 are used as the first controller for an intake amount of external air, the first and second conditions are determined by the opening level of each damper 72. For example, a level of opening of first damper 72 is controlled to have two degrees representing the first and second conditions. The first location, as indicated by a solid line in FIG. 2, closes an opening region 76a of branched passage 76 where exhaust amount control chamber 70 connects to branched passage 76, and prevents the external air from entering. If first damper 72 is set at the first location, the external air only enters from cup body 4. The dotted line shown in FIG. 2 represents the second location, where opening region 76a of branched passage 76 is partially open. If first damper 72 is set at the second location, external air enters from branched passage 76, as well as cup body 4.

Figure 4:
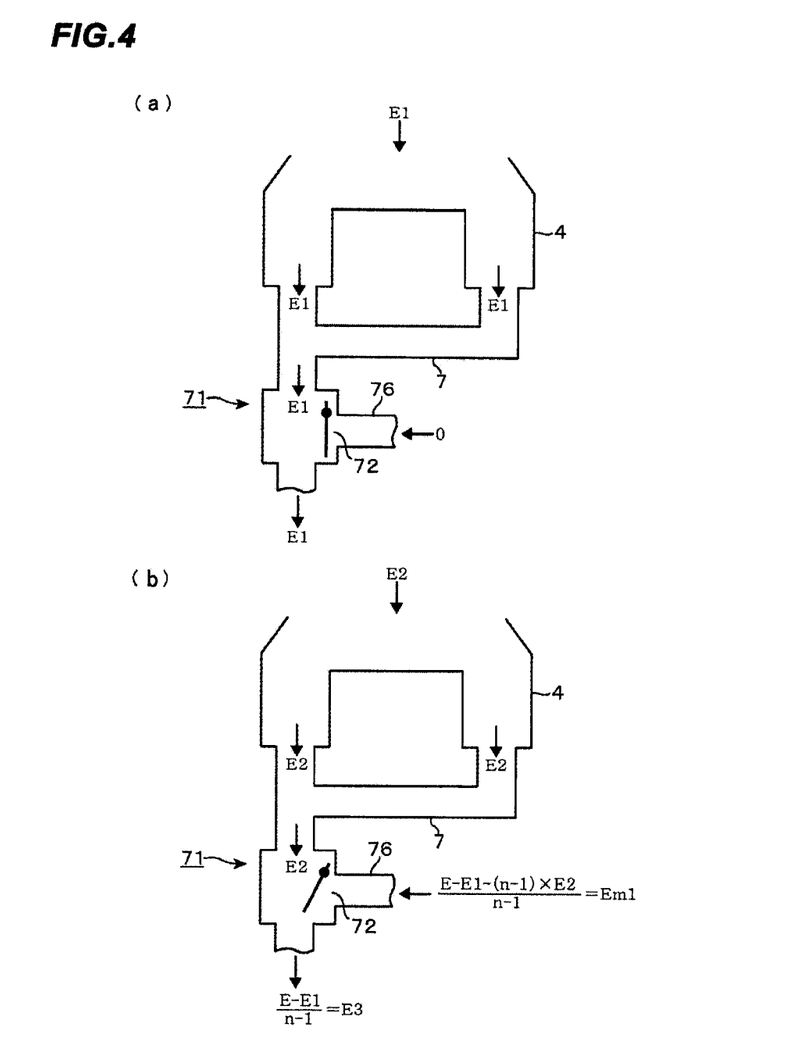
FIG. 4 shows diagrams (a) and (b) illustrating an operation of the first damper provided in the liquid processing apparatus of FIG. 1.

As illustrated in diagram (a) of FIG. 4, when first damper 72 is placed at the first location, the external air comes not from branched passage 76, but from cup body 4 in a first intake amount E1 of external air. As illustrated in diagram (b) of FIG. 4, when first damper 72 is placed at the second location, the external air comes from cup body 4 in a second intake amount E2, less than the first intake amount E1, so that an intake amount of external air from both cup body 4 and branched passage 76 equals (E−E1)/(n−1). The external air comes from branched passage 76 in the amount of {E−E1−(n−1)×E2}/(n−1).

Here, the intake amount of external air can be referred to as the exhaust amount. Thus, the first intake amount E1 of external air corresponds to the first exhaust amount E1, the second intake amount E2 of external air corresponds to the second exhaust amount E2, and the intake amount of (E−E1)/(n−1) corresponds to the exhaust amount of (E−E1)/(n−1).

Second damper 75 is configured to adjust the opening level between the first and the second locations, in order to control the intake amount of external air in common exhaustion passage 73. In the first location one end of common exhaustion passage 73 is closed to prevent external air from entering. In second location one end of common exhaustion passage 73 is open to allow external air to enter. Driving parts 77 and 78 are connected to first and second dampers 72 and 75 to control their respective opening levels. Driving parts 77 and 78 are controlled by control part 8.

The processing of wafer W in liquid processing apparatus 2 will now be described. A carrier (not shown) carries wafer W into liquid processing unit 21 of case 20 through loading/unloading port 27, after Wafer W is subjected to a pre-resist applying process. The lifting pin and the carrier secure wafer W horizontally on spin chuck 3 in liquid processing unit 21. Then chemical liquid nozzle 5 is moved from waiting region 54 to the applying location over liquid processing unit 21. While chemical liquid is dropped on the rotational center of the surface of wafer W, spin chuck 3 rotates with a set rotational frequency, for example, 1000 rpm. Accordingly, the resist applying process (chemical liquid applying process) is performed by diametrically spreading the chemical liquid with respect to wafer W by the centrifugal force of the rotation.

Then, by rotating wafer W with a rotational frequency of about 2500 rpm, a film drying process is performed while maintaining the chemical liquid layer thickness applied to the surface of wafer W. The solvent for the resist layer is then supplied to the circumferential edge portion of wafer W by solvent nozzle 65, while the rear surface of wafer W is supplied with chemical liquid from cleaning nozzle 67, and spin chuck 3 is rotated with a rotational frequency of about 1000 rpm. Thus, the edge cut process for removing unnecessary resist layer on the circumferential edge portion wafer W and the cleaning process for cleaning the rear surface of wafer W are performed at the same time. Finally, spin chuck 3 is rotated with a rotational frequency of about 2000 rpm, thus performing the drying process for drying wafer W by shaking off the solvent and cleaning liquid.

After being subjected to the processes described in liquid processing unit 21 described above, the carrier transfers wafer W from case 20 to the next step through loading/unloading port 27. Assuming that four liquid processing units 21 to 24 exist, wafers W that have not been processed are sequentially transferred to liquid processing unit 21, liquid processing unit 22, liquid processing unit 23, and liquid processing unit 24 by the carrier. In each liquid processing unit 21 to 24, the resist liquid applying process, film drying process, edge cut process, and drying process are sequentially performed for wafers W in the order they are transferred. The edge cut process includes the cleaning process for the rear surface. As described hereafter, the edge cut process is considered to perform the cleaning process for the rear surface simultaneously. The carrier sequentially transfers wafers W from liquid processing units 21, 22, 23, and 24 to the outside as the processings are completed.

Referring to FIG. 5, control part 8 will be described hereinafter. Reference number 80 illustrated in FIG. 5 indicates a bus to which memory and a CPU are connected. The memory and CPU are illustrated in function as a block. A damper program 81 is configured to output instruction for opening to driving parts 77 and 78 of first and second dampers 72 and 75 based on the location of chemical liquid nozzle 5. In the illustrated embodiment, first damper 72 is provided to each liquid processing unit 21 to 24. Thus, for the purpose of simple description, liquid processing units 21 to 24 are referred as first unit 21 to fourth unit 24. Further, the first damper in liquid processing unit 21 is referred as first damper 72a, the first damper in liquid processing unit 22 is referred as first damper 72b, the first damper in liquid processing unit 23 is referred as first damper 72c, and the first damper in liquid processing unit 24 is referred as first damper 72d.

Damper program 81 is stored in a storage medium, for example, a flexible disk, a compact disk, or a magnetic disk (MD). Damper program 81 is installed in a computer, such as control part 8, and stored in a program storage part. Particularly, in each of liquid processing units 21 to 24, as described above, exhaustion is performed such that one of two intake amounts of external airs, such as the first intake amount E1 of external air and the second intake amount E2 of external air, is formed in cup body 4 for the purpose of processing. The first intake amount E1 is set as larger than the second intake amount E2. Larger intake amount means larger exhaust amount.

The first intake amount E1 is the amount of external air coming into cup body 4 during the resist applying process described above. During the process, the chemical liquid supplied to the central portion of wafer W is spread to the outside of wafer W by the centrifugal force of the rotation. Further, because the unnecessary chemical liquid is shaken off and scattered, the amount of mist generated is large, and a large intake amount (exhaust amount) of external air is required to exhaust the mist.

The second intake amount E2 is the amount of external air entering cup body 4 during the processes other than the liquid applying process, for example, the film drying process, edge cutting process, and drying process. During the film drying process, the amount of mist generated is less than that in the resist applying process. In order to form an applying layer with a uniform thickness on the surface of wafer W, a low exhaustion condition can be set.

Under a high exhaustion condition, the edge region of the circumference of wafer W is easily dried, and the thickness of the layer at the edge region of the circumference becomes greater. Further, because the amount of mist during the edge cut process or drying process is less than that in the resist applying process, the mist is sufficiently exhausted under low exhaustion condition.

According to damper program 81, the opening level of first damper 72 is set at the first location for cup body 4 in which wafer W faces chemical liquid nozzle 5 with respect to a liquid processing unit, for example, the cup body 4 for which chemical liquid nozzle 5 is located at the applying location with respect to the liquid processing unit. The opening levels of first dampers 72 are set at the second location for all other cup bodies 4. Thus, the first and second locations of first dampers 72 are set as described above. Accordingly, exhaustion is performed for one cup body 4 such that the external air comes from cup body 4 in the first amount E1 as illustrated with respect to the diagram (a) of FIG. 4.

With regard to the other cup bodies 4, the inside cup body 4 is exhausted, and the atmosphere is also exhausted through branched passage 76. Thus, as illustrated with respect to the diagram (b) of FIG. 4, the external air comes from cup body 4 in the second amount E2. The exhaustion is performed downstream of first damper 72 of separate exhaustion passage 7 such that the external air comes from both cup body 4 and branched passage 76 in the total intake amount of (E−E1)/(n−1).

For example, assume that the number of liquid processing units is four, the first exhaust amount E1 is set as about 2.0 m³/min–3.0 m³/min, or about 2.4 m³/min, and the second exhaust amount E2 is set as about 1.0 m³/min–2.0 m³/min or about 1.5 m³/min. Because there are certain exhaust amounts for the first intake amount E1 and the second intake amount E2 during the resist layer forming process, the number of arranged liquid processing units is determined considering these exhaust amounts. If the number of arranged liquid processing units is too small, the work productivity cannot be enhanced. If the number of arranged liquid processing units is too big, a burden on the chemical liquid nozzle becomes large. Thus, the work productivity may be decreased. Thus, considering these facts, the number of liquid processing units can be N (for example, 3≤N≤6).

Damper program 81 outputs an instruction to driving part 78 of second damper 75 such that second damper 75 is set at the first location (that is the location where one end of common exhaustion passage 73 is closed) when chemical liquid nozzle 5 is placed at the location facing wafer W with respect to one liquid processing unit, for example, at the applying location with respect to one liquid processing unit. Damper program 81 outputs an instruction to driving part 78 of second damper 75 such that second damper 75 is set as the second location (that is the location where one end of common exhaustion passage 73 is open) when chemical liquid nozzle 5 is not placed at the location facing wafer W with respect to any liquid processing unit, for example, is not at the applying location with respect to any liquid processing unit. Second damper 75 is set to the second location when chemical liquid nozzle 5 is in the waiting region or chemical liquid nozzle 5 is moving.

A switching timing for first and second dampers 72 and 75 by damper program 81 can be properly set according to a processing. The switching timing can be determined according to whether chemical liquid nozzle 5 is placed at the applying location with respect to a liquid processing unit. For example, when chemical liquid nozzle 5 is placed at the applying location, first damper 72 is switched from the second location to the first location, and thus second damper 75 is switched to the first location, in this liquid processing unit. When chemical liquid nozzle 5 deviates from the applying location, first damper 72 is switched from the first location to the second location and second damper 75 is switched to the second location, in this liquid processing unit.

The location of chemical liquid nozzle 5 can be determined by determining in advance the location data representing the applying location for chemical liquid nozzle 5 for each liquid processing unit and checking whether chemical liquid nozzle 5 is at any of those locations by checking the side of driving part 55 of nozzle 5. Once the location of chemical liquid nozzle 5 is determined, damper program 81 controls the opening level of first and second dampers 72 and 75 accordingly. For example, this can be accomplished by, for example, connecting the motor of driving part 55 to an encoder to determine the location data of chemical liquid nozzle 5.

Figure 6:
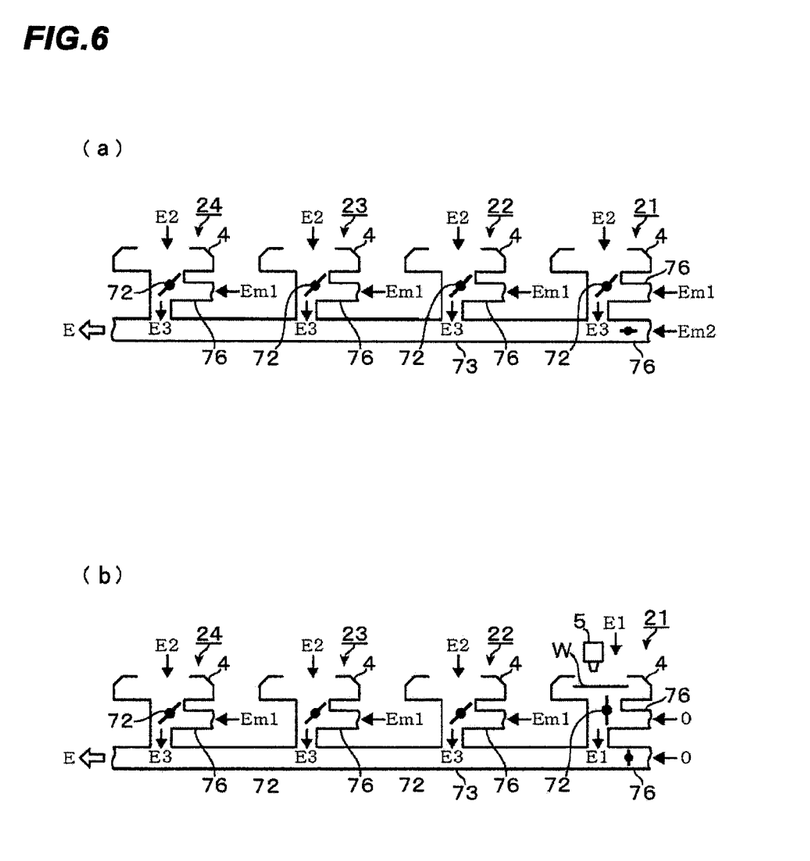
FIG. 6 shows diagrams (a) and (b) illustrating a liquid processing method performed with the liquid processing apparatus of FIG. 1.

An exhaust amount control inside the liquid processing unit will be described with reference to drawings although these descriptions may overlap with those for the process of the liquid processing unit. The diagram (a) of FIG. 6 illustrates the idle condition, where chemical liquid nozzle 5 is placed in waiting region 54 and wafer W is not carried into any of first to fourth units 21 to 24. At the idle condition, all first dampers 72 are set to the second location for four liquid processing units, an external air comes from four cup bodies 4 in the second intake amount E2, second damper 75 is set to the second location, and one end of common exhaustion passage 73 is open. Accordingly, it is exhausted downstream of each of first dampers 72 for four cup bodies 4 such that an external air comes in the intake amount of $E3=(E-E1)/(n-1)$, while it is always exhausted in common exhaustion passage 73 of liquid processing unit 2 in the total exhaust amount E. Thus, when each of four cup bodies 4 is exhausted with the intake amount of external air of $E3=(E-E1)/(n-1)$, second damper 75 is open such that external air to enters common exhaustion passage 73 with a total exhaust amount E.

As one example of the values of the exhaust amount, there are the total exhaust amount E of 10.0 m$^3$/min, the set second intake amount of external air E2 of 1.5 m$^3$/min, the intake amount of external air Em1 by branched passage 76 of 0.6 m$^3$/min, the intake amount of external air Em2 by common exhaustion passage 73 of 1.0 m$^3$/min, and the other intake amount (exhaust amount) of external air of 0.4 m$^3$/min. Here, the other intake amount (exhaust amount) of external air indicates a total intake amount of external air by moving mechanism 52 of chemical liquid nozzle 5, for example.

The diagram (b) of FIG. 6 illustrates the resist applying process in first liquid processing unit 21. Because chemical liquid nozzle 5 is located at the applying location where chemical liquid is applied with respect to first unit 21, first damper 72 is switched to the first location and second damper 75 is switched to the first location in first unit 21. Accordingly, the first intake amount E1 is exhausted from cup body 4 in first unit 21, the second intake amount E2 is exhausted from cup bodies 4 in second to fourth units 22 to 24. The timing for switching first and second dampers 72 and 75 is the same as described above.

As one example of the values of the exhaust amount, there are the total exhaust amount E of 10.0 m$^3$/min, the set first intake amount of external air E1 of 3.3 m$^3$/min, the set second intake amount of external air E2 of 1.5 m$^3$/min, the intake amount of external air Em1 by branched passage 76 of 0.6 m$^3$/min, the intake amount of external air Em2 by common exhaustion passage 73 of 0 m$^3$/min, and the other intake amount of external air of 0.4 m$^3$/min.

Figure 7:
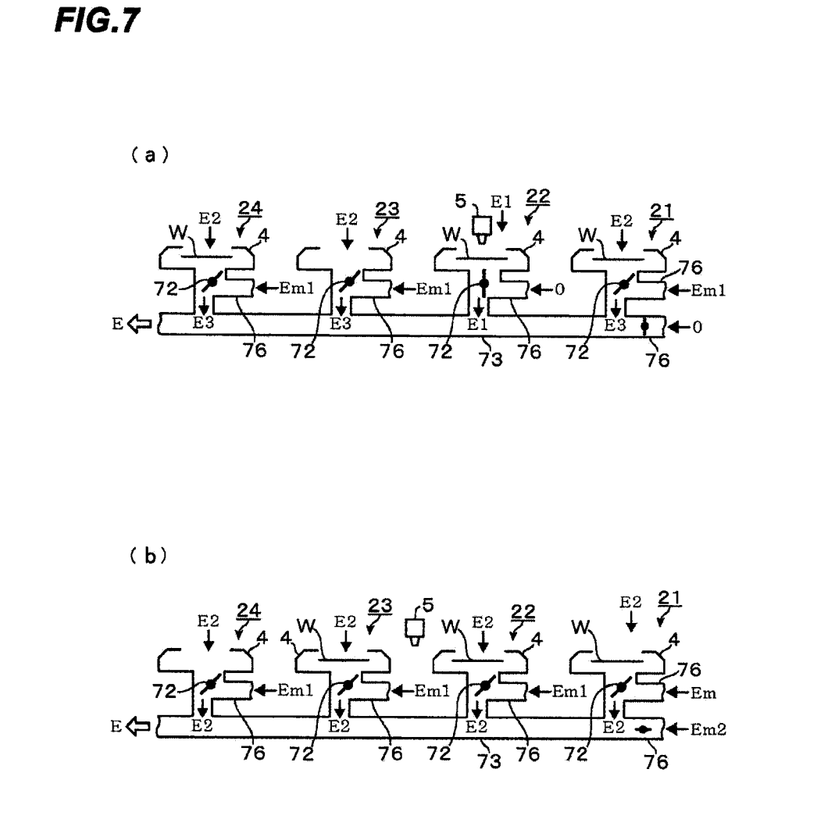
FIG. 7 shows diagrams (a) and (b) illustrating a liquid processing method performed with the liquid processing apparatus of FIG. 1.

As illustrated in the diagram (a) of FIG. 7, chemical liquid nozzle 5 is moved from first liquid processing unit 21 to second liquid processing unit 22. The illustrated resist applying process of second unit 22 is shown. Because chemical liquid nozzle 5 is placed at the location for applying chemical liquid with respect to second unit 22, first damper 72 is switched to the first location for second unit 22, and second damper 75 is set to the first location. Accordingly, cup body 4 of second unit 22 is exhausted in the first intake amount of external air E1, and cup bodies 4 of first, third and fourth units 21, 23 and 24 are exhausted in the second intake amount of external air E2. The examples of the values for the intake amount of external air are the same as described with respect to the diagram (b) of FIG. 6.

The diagram (b) of FIG. 7 illustrates the condition where chemical liquid nozzle 5 is between second liquid processing unit 22 and third liquid processing unit 23. Here, as described with respect to the idle condition, chemical liquid nozzle 5 is not placed at the applying location of any liquid processing units. Thus, for four liquid processing units 21 to 24, first damper 72 is set to the second location and second damper 75 is set to the second location. Thus, one end of common exhaustion passage 73 is open. The examples of the vales for the exhaust amounts are the same as described with respect to the diagram (a) of FIG. 6.

As described above, the N-number of liquid processing units are arranged in a lateral direction, chemical liquid is applied to wafer W in the liquid processing unit through common chemical liquid nozzle 5. Thus, even if a plurality of liquid processing units is prepared, one liquid processing unit at a time performs the resist applying process where exhaustion is performed in high exhaust amount (the first intake amount E1). Thus, first damper 72 is configured such that the liquid processing unit for performing the resist applying process receives external air from cup body 4 in the first intake amount E1 and the other liquid processing units receive external air from each cup body 4 in the second intake amount E2 and the external air comes from each branched passage 76 in the amount of $(E-E1)/(n-1)$. Thus, even if the number of liquid processing units is increased, the conventional total exhaust amount is not increased.

The total exhaust amount E and the first intake amount E1 (the first exhaust amount E1) have the relationship of $E=(n-1)\times E1$. The first intake amount E1 corresponds to the high exhaust amount during a spin coating. Thus, the total exhaust amount E of a liquid processing apparatus having N-number of cup bodies 4 is $E=(n-1)\times E1$ while the total exhaust amount of $E=n\times E1$ is required in a conventional apparatus. Accordingly, the total exhaust amount that corresponds to the total exhaust amount for the apparatus having three arranged cup bodies 4 can afford the exhaustion of four cup bodies 4. Because the number of liquid processing units can be increased without changing the total exhaust amount E of liquid processing apparatus 2, increasing the total exhaust amount can be prevented while increasing the number of liquid processing units, in comparison with the conventional apparatus.

The number of liquid processing units provided in one liquid processing apparatus 2 can be increased to increase productivity. However, according to the present invention, the value of the liquid processing apparatus can be enhanced because the total exhaust amount E is restrained for an increased number of liquid processing units and the work productivity can be enhanced while preventing the increase of the organic exhaust amount.

On the contrary, when a plurality of liquid processing units is prepared in the configuration where one liquid processing unit has one chemical liquid nozzle, the resist applying process may be performed for two or more liquid processing units. In this case, the number of the liquid processing units in which exhaustion is performed with high exhaust amount becomes two or more. Thus, even if exhaustion is performed with low exhaust amount for the other liquid processing units, the total exhaust amount is increased in the case the number of the arrangement of the cup bodies is increased.

As described above, adjusting the opening level of first and second dampers 72 and 75 controls the intake amount of external air. Because the opening level of first and second dampers 72 and 75 is controlled according to the location of chemical liquid nozzle 5 as described above, the control can be easily performed.

Further, the open end of common exhaustion passage 73 is adjusted to be open or closed by second damper 75. Thus, even if the exhaustion is performed such that the second intake amount E2 is formed in each of all cup bodies 4 during the idle condition or while moving chemical liquid nozzle 5, the total exhaust amount E is held constant by controlling the intake amount of external air in common exhaustion passage 73. Accordingly, the changing of the second intake amount E2 between each cup body 4 can be minimized, and a stable exhaustion can be performed.

As described above, the change of total exhaust amount E can be prevented by second damper 75 even if the opening level of first damper 72 is controlled in two steps. Thus, the number of components can be reduced, and the parameters for exhaust amount control can be reduced. Accordingly, a simple liquid processing apparatus with an easy control mechanism can be achieved.

The switch of the opening levels of first and second dampers 72 and 75 according to the location of chemical liquid nozzle 5 can be controlled by a recipe in which each process is written to correspond to the opening levels of first and second dampers 72 and 75. Further, the control can be executed by preparing a data table in which the location of chemical liquid nozzle 5 corresponds to the opening level of first and second dampers 72 and 75.

Figure 8:
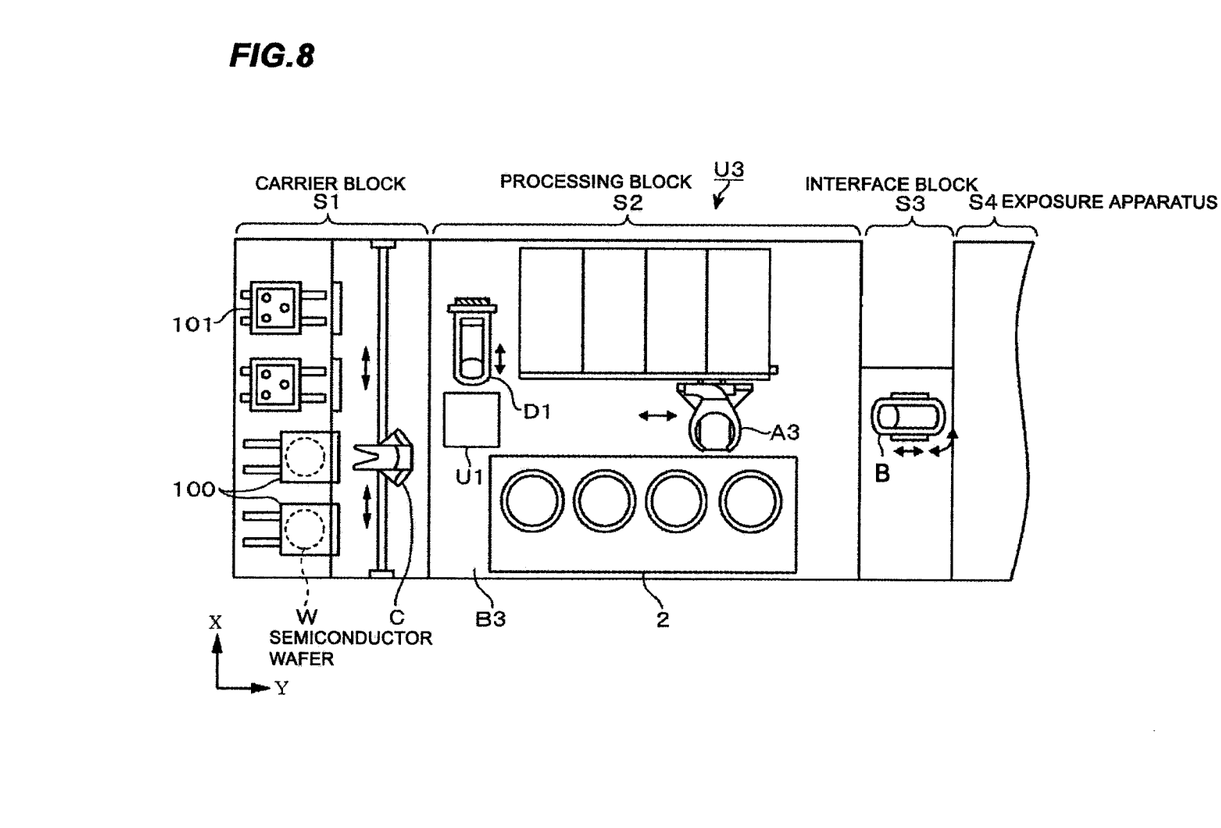
FIG. 8 is a plan view illustrating the resist pattern forming device provided in the liquid processing apparatus of FIG. 1.
Figure 9:
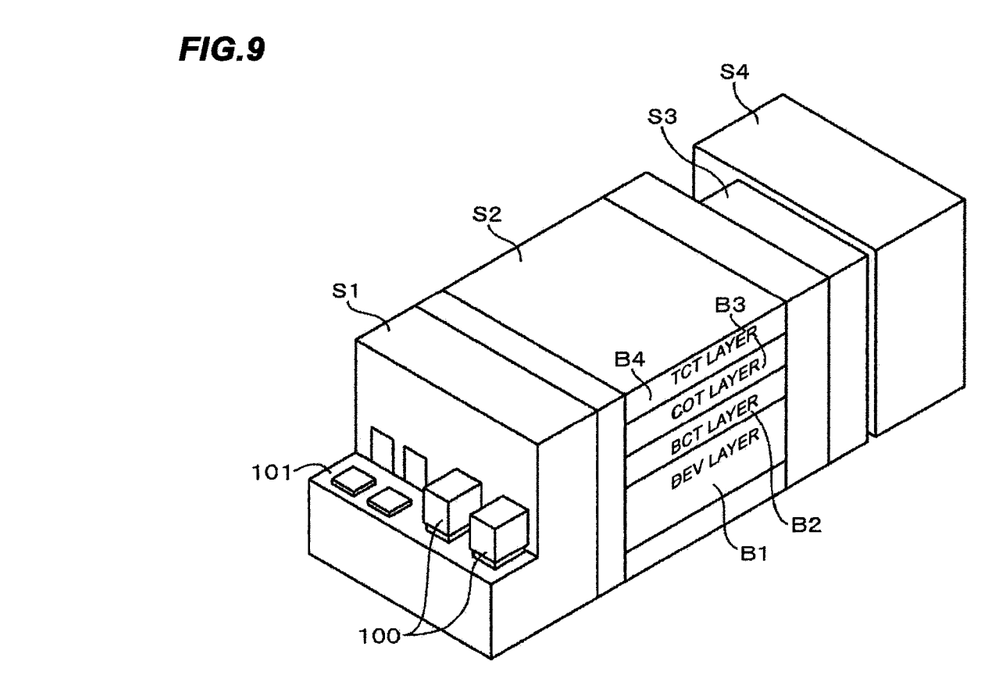
FIG. 9 is a perspective view of the resist pattern forming device of FIG. 8.

An example of a resist pattern forming system in which an applying and development apparatus have the liquid processing apparatus connected to an exposure part (an exposing apparatus) will be described hereinafter. FIG. 8 is a plan view of the system, and FIG. 9 is a perspective view of the system. The system includes a carrier block S1. Carrier block S1 is configured such that a transfer arm C withdraws wafer W from a sealed carrier 100 on a loading plate 101 and transfers wafer W to an adjacent processing block S2, and transfer arm C takes and returns the wafer W that has been processed on processing block S2 to and from carrier 100.

Processing block S2, as illustrated in FIG. 9, includes, for example, a first block (DEV layer) B1 for development processing, a second block (BCT layer) B2 for forming an anti-reflective layer under the resist layer, a third block (COT layer) B3 for applying the resist liquid, a fourth block (TCT layer) B4 for forming an anti-reflective layer on the resist layer, which are sequentially deposited.

Figure 10:
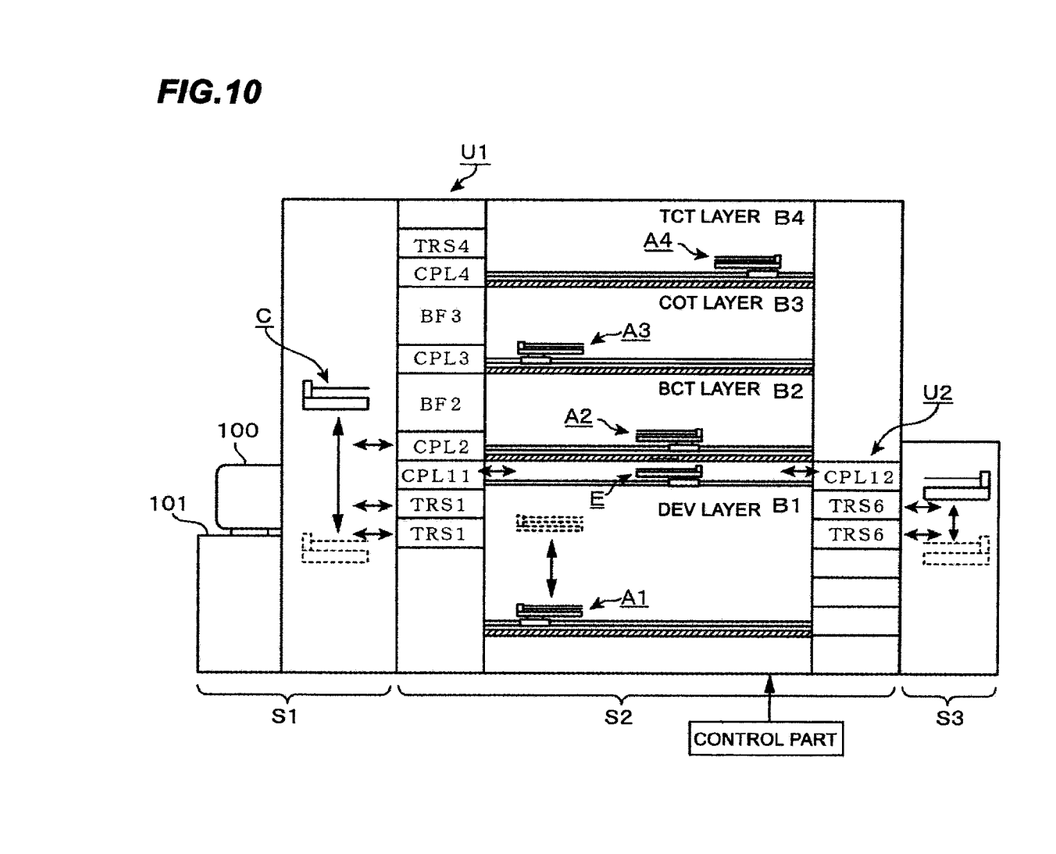
FIG. 10 is a cross sectional view of the resist pattern forming device of FIG. 8.

Each of second and fourth blocks (BCT layer and TCT layer) B2 and B4 includes the liquid processing apparatus to apply chemical liquid for forming the anti-reflective layer by spin coating according to the present invention, processing units of heating and cooling systems to perform pre- and post-processings in the liquid processing apparatus, and carrying arms A2 and A4 provided between the applying processing apparatus and the processing units to transfer wafer W between the applying processing apparatus and the processing units. In third block (COT layer) B3, the chemical liquid is the resist liquid. Third block B3 has the same configuration except in that third block has a hydrophobic processing unit. A development unit is deposited in two steps in one DEV layer B1 forming the first processing block (DEV layer) B1. DEV layer B1 has a common carrying arm A1 to carry wafer W to the two-step development unit. Processing block S2 includes, as illustrated in FIGS. 8 and 10, a shelf unit U1. A transfer arm D1 that is adjacent to shelf unit U1 and is configured to rise and fall carries wafer W between the elements of shelf unit U1.

In the resist pattern forming system, wafer W is sequentially carried from carrier block S1 to a transfer unit of shelf unit U1, such as a transfer unit CPL2 corresponding to second block (BCT layer) B2 by transfer arm C. Then, wafer W is carried in third block (COT layer) B3 through a transfer unit CPL3 by carrying arm A3. The surface of the wafer becomes hydrophobic in the hydrophobic processing unit, and a resist layer is formed in liquid processing apparatus 2. After forming the resist layer, wafer W is transferred to a transfer unit BF3 of shelf unit U1 by carrying arm A3.

Wafer W is then transferred to carrying arm A4 through transfer unit BF3 by transfer arm D1, and a transfer unit CPL4, and is transferred to a transfer unit TRS4 by carrying arm A4 after the anti-reflective layer has been formed on the resist layer. In some embodiments, the anti-reflective layer may be formed in second block (BCT layer) B2, rather than the anti-reflective layer formed on the resist layer or subjecting wafer W to hydrophobic processing.

A dedicated carrier, that is, a shuttle arm E is provided in an upper portion of DEV layer B1. Shuttle arm E carries wafer W from a transfer unit CPL11 provided in shelf unit U1 to a transfer unit CPL12 provided in a shelf unit U2. Wafer W on which the resist layer or the anti-reflective layer is formed is transferred to transfer unit CPL11 by transfer arm D1 through transfer units BF3 and TRS4. Then, wafer W is carried to transfer unit CPL12 of shelf unit U2 by shuttle arm E, and received in an interface block S3. The transfer units referenced as CPL in FIG. 10 also act as cooling units for temperature control. The transfer units referenced as BF also act as buffer units for placing a plurality of wafers W.

Then, wafer W is carried to exposure apparatus S4 by an interface arm B. Wafer W, after the exposure processing, is placed on a transfer unit TRS 6 of shelf unit U2, and then returned to processing block S2. The returned wafer W is subjected to a development in first block (DEV layer) B1, carried by carrying arm A1 into a transferring plate in shelf unit U1 which is within the range transfer arm C, and then returned to carrier 100 by transfer arm C. The reference numeral U3 illustrated in FIG. 8 indicates a group of processing units in which heating and cooling parts are deposited.

The liquid processing apparatus, in accordance with the present invention, is applicable to a liquid processing process for forming an anti-reflective layer or a development processing apparatus for development processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit indicated by the following claims.

What is claimed is:

1. A liquid processing apparatus comprising:
   n-number of substrate retainers arranged in parallel to each other in a common case, n being an integer identical to or greater than three, each of circumferences of the substrate retainers being surrounded with a cup body;
   a common chemical liquid nozzle configured to be movable along an arrangement direction of the substrate retainers and to sequentially apply a chemical photoresist liquid to substrates retained in the substrate retainers;
   n-number of cleaning nozzles, each being dedicated to one of the substrate retainers, supplying a cleaning solvent to the substrates after application of the chemical photoresist liquid by the chemical liquid nozzle;
   a plurality of separate exhaustion passages each connected to a corresponding cup body, each separate exhaustion passage being equipped with a branched passage open to the common case;
   a common exhaustion passage connected downstream of the separate exhaustion passages, inner atmosphere of the common exhaustion passage being inhaled and exhausted with a total exhaust amount E;
   a first controller connected to each of the separate exhaustion passages and configured to control the intake amount of external air from the corresponding cup body and from a corresponding branched passage; and
   a control part configured to generate a control signal setting the first controller,
   wherein in a first mode where the common chemical liquid nozzle is located at a setting location facing the substrate retained in the corresponding substrate retainer for one cup body, the first controller for said one cup body receives the external air only from said one cup body in a first intake amount E1, while the first controller for each of the remaining cup bodies receives the external air not only from each said remaining cup body in a second intake amount E2, with E2 being less than E1, but also receives air from the corresponding branched passage for each said remaining cup body, so that the total exhaust amount E will remain constant;
   wherein in a second mode where the common chemical liquid nozzle is not located at a setting location facing the substrate on the corresponding substrate retainer for any cup body, the first controller for each cup body receives the external air not only from each cup body in the second intake amount E2, but also receives air from the corresponding branched passage for each cup body, so that the total exhaust amount E will remain constant,
   wherein the common exhaustion passage comprises one end directly open in the common case, and a second controller for the intake amount of external air to control the intake amount of external air entering the common exhaustion passage, and
   wherein the control part is configured to change the intake amount of external air by the second controller between when the chemical liquid nozzle is placed at the setting location for the one cup body and when the chemical liquid nozzle is not placed at the setting location for any of the cup bodies.

2. The apparatus of claim 1, wherein the control part controls the second controller such that the external air is not received in the common exhaustion passage when the chemical liquid nozzle is placed at the setting location for the one cup body, and the external air is received in the common exhaustion passage when the chemical liquid nozzle is not placed at the setting location for any of the cup bodies.

3. The apparatus of claim 1, wherein the first controller is a damper.

4. The apparatus of claim 1, wherein the second controller is a damper.

5. The apparatus of claim 1, wherein the number of the substrate retainers is not less than 3 but not more than 6 ($3 \leq n \leq 6$).

6. The liquid processing apparatus of claim 1, wherein a first condition is defined as a state where the external air is not inhaled from the common exhaustion passage.

7. The liquid processing apparatus of claim 1, wherein a second condition is defined as a state where the external air is inhaled from the common exhaustion passage.

* * * * *